United States Patent [19]

Koyama et al.

[11] 4,127,321
[45] Nov. 28, 1978

[54] LIQUID CRYSTAL DISPLAY APPARATUS

[75] Inventors: Masaharu Koyama; Tadashi Ishibashi; Hironari Tanaka, all of Mobara, Japan

[73] Assignee: Hitachi, Ltd., Tokyo, Japan

[21] Appl. No.: 718,830

[22] Filed: Aug. 30, 1976

[30] Foreign Application Priority Data

Sep. 5, 1975 [JP] Japan ............... 50-106945

[51] Int. Cl.² .............. G02F 1/16; H05K 1/00; H01L 39/02
[52] U.S. Cl. ................ 350/336; 339/17 CF; 357/80
[58] Field of Search ............ 350/160 LC; 357/80; 339/17 CF

[56] References Cited

U.S. PATENT DOCUMENTS

| 3,323,023 | 5/1967 | Walker | 339/17 CF |
|---|---|---|---|
| 3,380,016 | 4/1968 | Samson | 339/17 CF |
| 3,588,618 | 6/1971 | Otte | 339/17 CF |
| 3,674,342 | 7/1972 | Castellano | 350/160 LC |
| 3,698,449 | 10/1972 | Sorkin | 350/160 LC |
| 3,718,842 | 2/1973 | Abbott | 350/160 LC |
| 3,807,833 | 4/1974 | Graham | 350/160 LC |
| 3,883,213 | 5/1975 | Glaister | 350/160 LC |
| 3,914,021 | 10/1975 | Nishimura | 339/17 CF |
| 3,973,388 | 8/1976 | Yosnida | 350/160 LC |
| 4,025,162 | 5/1977 | Yagi | 350/160 LC |

Primary Examiner—Verlin R. Pendegrass
Assistant Examiner—Donald P. Walsh
Attorney, Agent, or Firm—Charles E. Pfund

[57] ABSTRACT

The display apparatus comprises a liquid crystal display element, a circuit board and electroconductive members interconnecting them. External terminals are formed on one substrate of the display element and input terminals are formed on the circuit board. The external terminals are electrically and mechanically interconnected by rigid electroconductive members through conductive films.

6 Claims, 7 Drawing Figures

LIQUID CRYSTAL DISPLAY APPARATUS

BACKGROUND OF THE INVENTION

This invention relates to a liquid crystal display apparatus and more particularly to an improved construction for mounting a display element on a circuit board.

As shown in FIG. 1, a prior art field effect reflection type liquid crystal display element 30 comprises upper and lower transparent insulator substrates 1 and 2, electrodes (not shown) having a predetermined pattern and mounted on the inner surfaces of the substrates and a peripheral sealing member 3 sealing the peripheries of the substrates. A liquid crystal 5 is filled into a cell 4 thus formed through a filling port, not shown. The filling port is sealed after filling the liquid crystal. When an electrical potential is impressed across the electrodes of the upper and lower substrates, the liquid crystal between the electrodes undergoes an optical change to display a digit, character or symbol.

Polarizing plates 6 and 7 are applied onto the outer surfaces of the upper and lower substrates 1 and 2. The upper substrate 1 has a length longer than the lower substrate, and a plurality of external terminals 9 are formed on the lower surface of the upper substrate at portions projecting beyond the opposite ends of the lower substrate 2. These terminals are connected through electroconductive rubber members 10 to input terminals 12 formed according to a circuit pattern on a circuit board 11 made of insulator. Clamping members 13 are secured to the circuit board 11 by screws 14 for securing the liquid crystal display element 30 to the circuit board 11.

With this construction, since electroconductive rubber members having a low mechanical strength are sandwiched and used to electrically interconnect terminals 12 and 9, the reliability of the display apparatus is low. Further, mounting of the display element on the circuit board by clamping members 13 and screws 14 increases the number of the component elements as well as the assembling steps, thereby hindering mass-production and increasing the cost of manufacturing.

SUMMARY OF THE INVENTION

Accordingly, it is an object of this invention to provide an improved liquid crystal display apparatus provided with a reliable electric connection between the display element and a circuit board supporting the same.

Another object of this invention is to provide an improved liquid crystal display apparatus capable of simplifying the mounting operation of the display element on the circuit board and decreasing the number of the component parts thereby to reduce the cost of manufacturing.

According to this invention, there is provided a liquid crystal display apparatus comprising a liquid crystal display element including a pair of parallel upper and lower insulator substrates, inner electrodes formed on the opposing surfaces of the substrates, a liquid crystal filled between the inner electrodes, and a plurality of external terminal electrodes formed on one substrate and connected to one of the inner electrodes for displaying a desired pattern; a circuit board for supporting the display element and provided with a plurality of input terminals; and rigid electroconductive members for electrically interconnecting the external terminal electrodes and the input terminals.

Advantageously, electroconductive films are provided to cover the external terminal electrodes and the end side surface of the substrate so that the rigid electroconductive members are connected to the respective external terminals through the conductive films.

DESCRIPTION OF THE PREFERRED EMBODIMENTS

Figure 1:
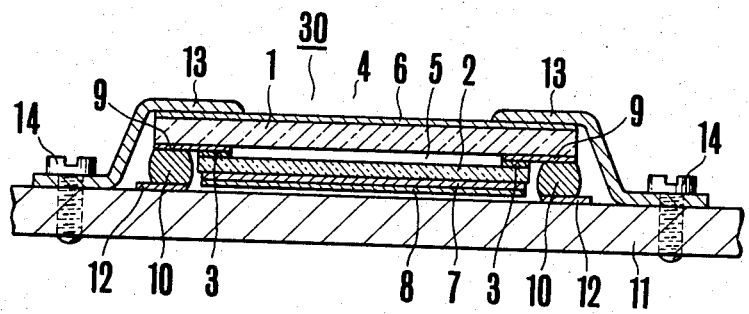
FIG. 1 is a longitudinal sectional view showing one example of a prior art liquid crystal display apparatus.
Figure 2:
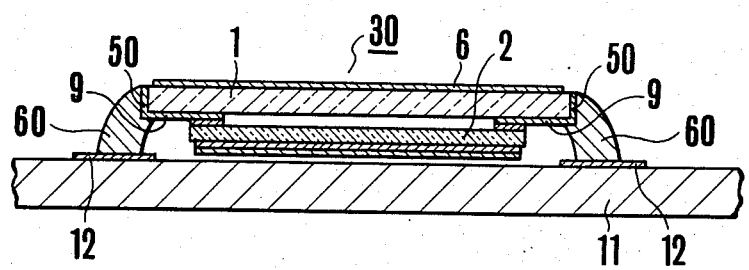
FIG. 2 is a similar view showing one embodiment of the liquid crystal display apparatus embodying the invention.
Figure 3:
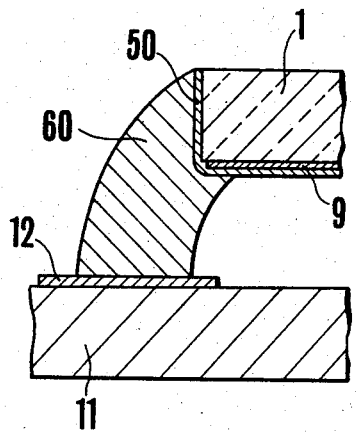
FIG. 3 is an enlarged sectional view showing a portion of the display apparatus shown in FIG. 2.
Figure 4:
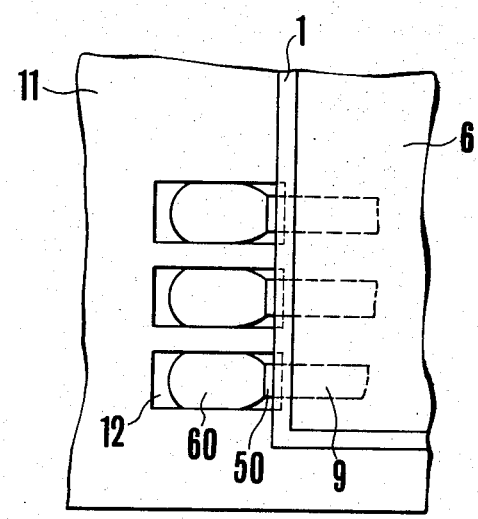
FIG. 4 is an enlarged plan view of a portion of the display apparatus shown in FIG. 2.

A preferred embodiment of this invention is illustrated in FIGS. 2, 3 and 4 in which component elements corresponding to those shown in FIG. 1 are designated by the same reference numerals. This embodiment is different from the prior art display apparatus shown in FIG. 1 in that the upper insulator substrate 1 is electrically connected to and supported by the circuit board 11 through electroconductive films 50 and electroconductive members 60. FIG. 3 shows the detail of this construction. As shown, the electroconductive films 50 cover the side surface discretely and the external terminal electrodes 9 leading from the inner electrodes, at the lower side of the upper substrate 1 projecting beyond the lower substrate 2, and the electroconductive films 50 are formed by vapor depositing a mixture of the powders of nickel and chromium to a thickness of 500Å to 1500Å and then vapor depositing gold to a thickness of 2000Å to 5000Å. Alternatively, the films may be formed by firstly vapor depositing chromium and then gold, or by vapor depositing a mixture of nickel and chromium and then copper to a thickness of 1000Å to 5000Å. Chromium enhances the adhesion to the insulator substrate usually made of glass and acts as a prime coating for the nickel film having a high soldering-ability. Gold and copper are used to impart antioxidation and soldering-ability properties to the vapor deposited film. The electroconductive members 60 are disposed between the conductive films 50 and the input terminals 12 for electrically and mechanically interconnecting them. As the members 60, solder is used, the type thereof being not limited.

As shown in FIG. 4, a plurality of spaced input terminals 12 are formed on the circuit board 11 at positions corresponding to the external terminals 9 for driving the electrodes in the cell. Each external terminal 9 is led from the inner electrode, not shown, and extends along the lower surface of the upper substrate 1. Obviously, the external terminal electrodes 9 formed on the circuit board by, for example, printing extend to the outside of the cell 4 without impairing the air tightness thereof. A mask is applied to cover discretely the end side surface and the lower surface of the upper substrate except the external terminals 9, and the electroconductive films 50 are vapor deposited through the mask. Corresponding input terminals 12 and electroconductive films 50 are electrically interconnected by soldering. The electroconductive members 60 thus formed electrically and mechanically interconnect the display element and the circuit board.

Figure 5:
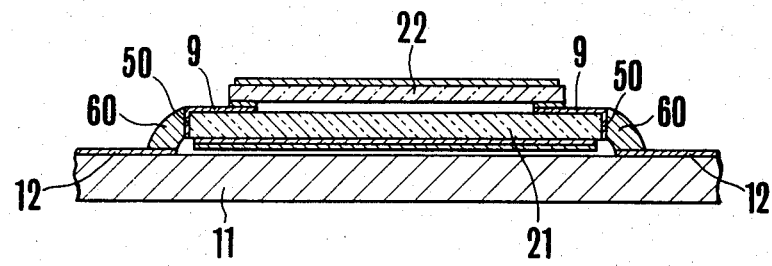
FIG. 5 is a longitudinal sectional view showing a modification of this invention.
Figure 6:
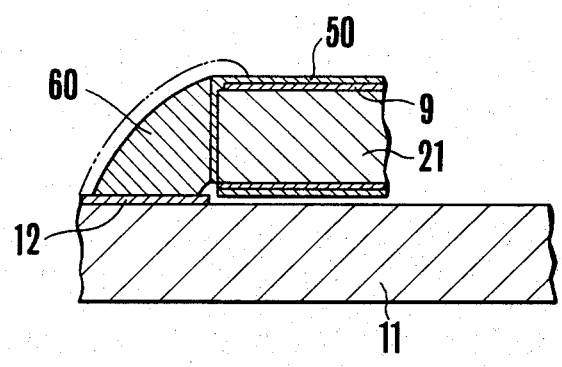
FIG. 6 is an enlarged sectional view showing a portion of the display apparatus shown in FIG. 5

FIGS. 5 and 6 show another embodiment of this invention in which component elements similar to those shown in the first embodiment are designated by the same reference numerals.

In this embodiment, the display element 30 shown in FIG. 2 is inverted so that the upper and lower substrates 1 and 2 shown in FIG. 2 are designated as the lower substrate 21 and the upper substrate 22 respectively. The displayed digits, etc. are faced upwardly. In this case, the external terminals 9 led from the inner electrodes are formed on the upper surface of both ends of the lower substrate 21 and electroconductive films 50 are formed to cover the side surfaces of the lower substrate discretely and the terminals 9. With this construction, the height of the solder members 60 for electrically and mechanically connecting the conductive films 50 to the input terminals 12 can be made smaller than that of the previous embodiment thus improving the strength. With a height from 0.3 to 0.7 mm, the satisfactory strength can be ensured. When solder is applied to also cover the upper surface of the lower substrate 21 as shown by phantom line in FIG. 6, the display element 30 can be more firmly secured to the circuit board 11. Thus the solder mumbers 60 not only electrically interconnect the terminals 9 and 12 but also secure the display element to the circuit board, thereby simplifying the mounting operation of the display element. Further, clamping members, screws and conductive rubber elements shown in FIG. 1 are not necessary thereby reducing the cost.

Figure 7:
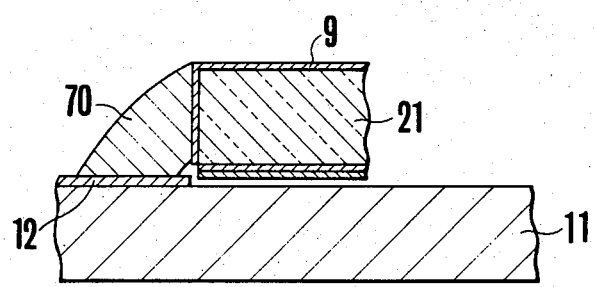
FIG. 7 is a similar view to FIG. 6 of a modification.

In a modification as shown in FIG. 7, the solder may be substituted by any conductive cement 70, in which case the external terminals 9 may be extended to cover the end side surface of the substrate, thus eliminating the conductive films 50.

While the invention has been described in terms of a field effect reflective type liquid crystal display apparatus, it will be clear that the invention is also applicable to liquid crystal display apparatus of different type.

What is claimed is:

1. Liquid crystal display apparatus comprising a liquid crystal display element including a pair of parallel upper and lower insulator substrates, inner electrodes formed on the opposing surfaces of said substrates, a liquid crystal filled between the inner electrodes, and a plurality of external terminal electrodes formed on one of said substrates and connected to one of said inner electrodes for displaying a desired pattern, said external terminal electrodes extending along the side surface of said one substrate; a circuit board for supporting said display element and provided with a plurality of input terminals, said input terminals being at positions corresponding to the external terminals and lying on the circuit board laterally clear of and substantially at right angles with respect to said side surface of said one substrate; and rigid electroconductive solder members bonding said input terminals to said side surfaces at right angles thereto for electrically interconnecting each of said external terminals and said input terminals respectively, and providing bonded lateral and vertical fixed rigid support of said display element on said circuit board.

2. The display appratus according to claim 1 wherein conductive films are provided to cover said external terminals and the end side surface of said substrate discretely, and one end of each of said electroconductive members is connected to said film.

3. The display apparatus according to claim 2 wherein said external terminals are formed on the lower surface of the upper substrate.

4. The display apparatus according to claim 2 wherein said external terminals are formed on the upper surface of the lower substrate.

5. The display apparatus according to claim 2 wherein said conductive members are made of solder and each conductive film comprises a layer of NiCr and a layer of gold.

6. The display apparatus according to claim 2 wherein said conductive members are made of solder and each conductive film comprises a layer of NiCr and a layer of copper.

* * * * *